Sept. 17, 1968 D. W. SHAW 3,401,449

METHOD OF FABRICATING A METAL BASE TRANSISTOR

Filed Oct. 24, 1965 3 Sheets-Sheet 1

Don W. Shaw
INVENTOR.

Don W. Shaw
INVENTOR.

Don W. Shaw
INVENTOR 3,401,449
Patented Sept. 17, 1968

3,401,449
METHOD OF FABRICATING A METAL BASE TRANSISTOR

Don W. Shaw, Garland, Tex., assignor to Texas Instruments Incorporated, Dallas, Tex., a corporation of Delaware Filed Oct. 24, 1965, Ser. No. 504,448
4 Claims. (Cl. 29—577)

Figures 1, 2:
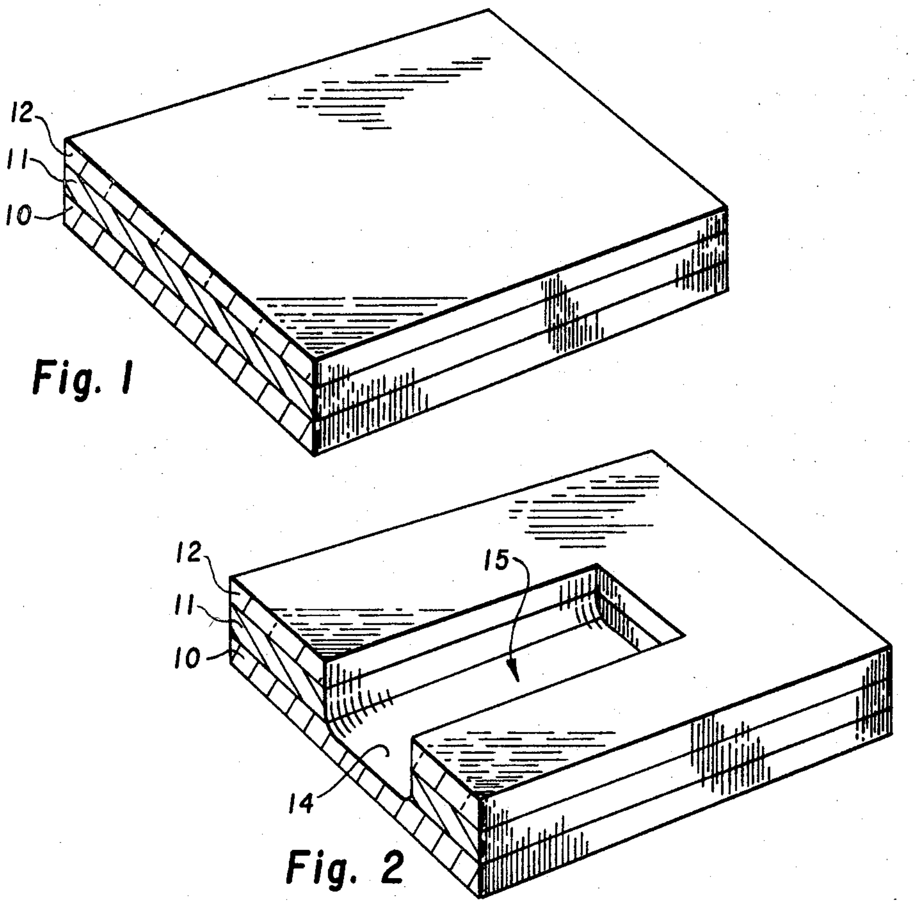

This invention relates to semiconductor devices, and more particularly to an improved method for manufacturing a metal base transistor.

It has been recognized that a metal base transistor has several theoretical advantages over any other transistor-type, current-controlled device. For example, it has been shown that the ultimate theoretical value of the alpha cut-off frequency $f_a$ would be on the order of $2\times10^{10}$ c.p.s. and the maximum frequency of oscillation $f_{max}$ would be on the order of $1\times10^{11}$ c.p.s. In both cases, the values are a factor of two better than the corresponding values which could be theoretically expected from any other transistor-type, current-controlled device.

The metal base transistor also has a low input impedance, a high output impedance, a current gain which is essentially independent of current level, and a low feedback factor. Stable base conditions are established by the input (emitter) current and output (collector) voltage. Input voltage is considered a dependent variable determined uniquely by the input current. In the common base configuration, power gain is realized in these devices by virtue of the ratio of output to input impedance. The normally preferred common emitter configuration provides both current and voltage gain.

The high-frequency limit, $f_a$, of the metal base transistor is determined by the relaxation time of the emitter base structure together with the collector transit time. For hot electron transport across the thin metallic base layer in this type of device, the base transit time, approximately $10^{-12}$ seconds, is negligible. The extremely low base spreading resistance offered by the metallic base layer also reduces the internal feedback factor and increases the Q at the output terminals in contrast with a conventional transistor. These effects combine to produce useful power gain at frequencies significantly higher than $f_a$.

A thin film metal base transistor also offers the possibility of performing satisfactorily under conditions known to be detrimental to semiconductor minority-carrier devices. For example, the metal base transistor should be relatively immune from radiation effects due to the majority-carrier aspects of the device because degradation of minority-carrier lifetime is not a concern under these conditions. This factor is important in considering the design of electronic systems for nuclear reactor or space applications where components are subjected to radiation fields.

In U.S. Patent No. 3,322,581, filed concurrently with the present application, and assigned to the assignee of the present invention, a novel method was described and claimed for fabricating a metal base transistor which did not require the deposition of semiconductor material directly upon the metal base region. Accordingly, that invention involves forming a hole or pocket within a single crystalline semiconductor substrate, (which may form the collector), selectively locating a metal layer at the bottom of the pocket, and epitaxially growing another single crystalline semiconductor region to fill the pocket, the epitaxial growth proceeding from the exposed single crystalline walls of the pocket and extending laterally over the metal layer to form the emitter region. More specifically, the method of selective location of the metal layer was described as first depositing a metal film entirely within the pocket, and then using photographic masking and etching techniques selectively removing the film from the walls of the pocket.

It is the object of this invention, however, to provide a novel and improved means for selectively locating the metal layer at the bottom of a pocket formed in the semiconductor substrate, the process not requiring a two step operation of deposition and selective removal, thereby providing an improvement over the process described in the concurrently filed application.

It is another object of the invention to fabricate a metal base transistor by a novel process which does not require deposition of single crystalline semiconductor material directly upon the metal base region.

In accordance with these and other objects, the present invention involves the fabrication of a metal base transistor by a process which comprises forming a high resistivity or semi-insulating layer of single crystalline semiconductor material adjacent a body of N-type semiconductor material (which body may form the collector), forming a hole or pocket within the semi-insulating layer to expose a surface of the N-type body at the base of the pocket, selectively electroplating a metal layer upon the exposed N-type collector surface at the base of the pocket, the walls of the pocket remaining exposed semi-insulating, single crystalline semiconductor material, and epitaxially growing another single crystalline N-type region to fill the pocket, the epitaxial growth proceeding from the exposed single crystalline walls of the pocket and extending laterally over the metal layer to form the emitter region. The selective electroplating of the metal layer upon the bottom of the pocket is achieved by making the N-type body the cathode in an electroplating bath, the high resistivity of the semi-insulating layer preventing the plating of any metal upon the exposed single crystalline walls of the pocket. The epitaxial growth of the emitter region therefore does not require that the deposition of the semiconductor material be directly upon the metal base region so this latter region may have an amorphous or dissimilar crystal structure.

Figure 7:
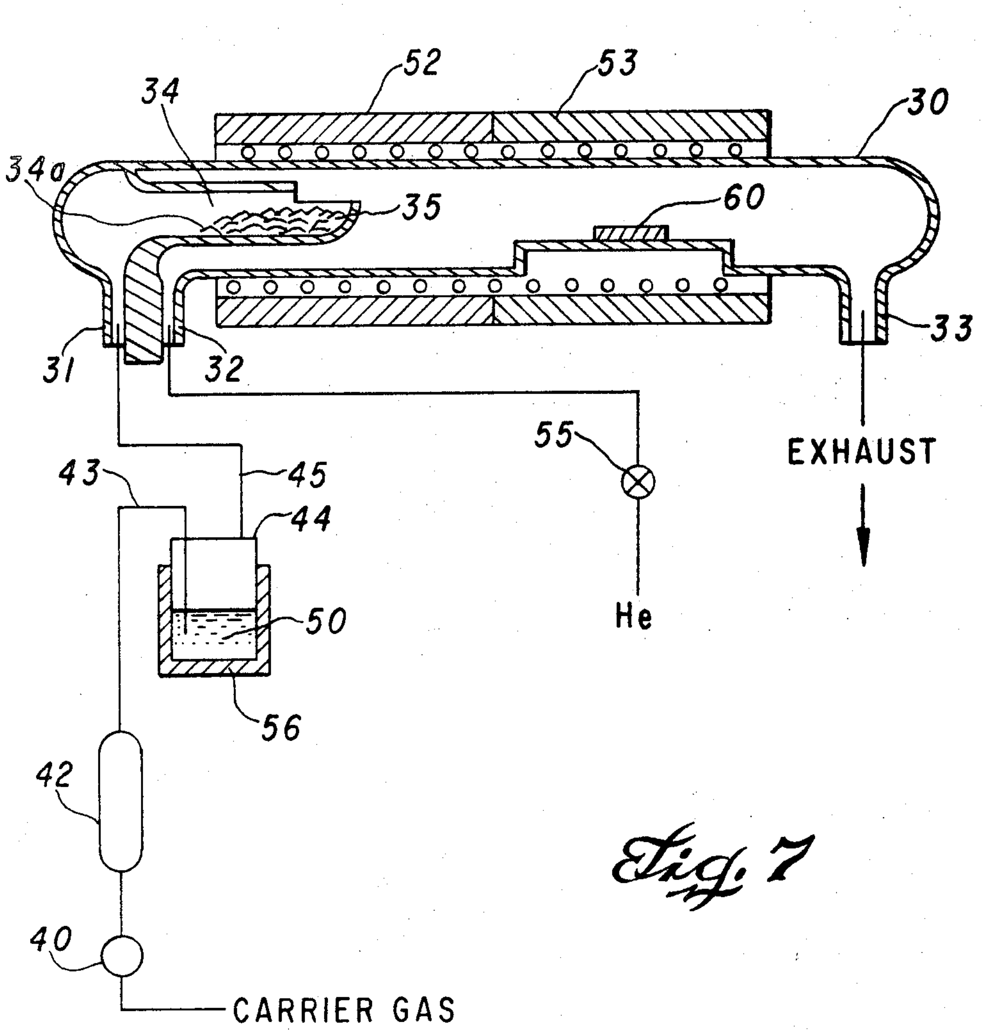

The novel features believed characteristic of this invention are set forth in the appended claims. The invention itself, however, as well as other objects, features, and advantages thereof, may best be understood by reference to the following detailed description of illustrative embodiments taken in conjunction with the accompanying drawings, wherein:

FIGURES 1–6 are pictorial views in section, showing subsequent steps in the fabrication of the present invention; and FIGURE 7 is a front elevation, partially in section, showing one form of apparatus utilized in the fabrication of the present invention.

The drawings are not necessarily to scale as dimensions of certain parts shown in the drawings have been modified and/or exaggerated for the purpose of clarity of illustration. Also, in the present specification and appended claims, the term epitaxial growth or deposition means the oriented growth of a single crystal upon a single crystal of either identical or similar crystal structure.

Referring to FIGURE 1, there is now described the first step in the fabrication of metal base transistors according to the process of this invention. A substrate 10 of single crystalline N-type semiconductor material having a resistivity perhaps $10^{-2}$ to $10^2$ ohm-cm. is used as the starting material. Upon this substrate 10 there is formed, by suitable epitaxial techniques for example, a layer 11 of very high resistivity or semi-insulating single crystalline semiconductor material, having a resistivity of perhaps $10^2$ to $10^8$ ohm-cm. As an alternative to epitaxially depositing the layer 11 upon the substrate 10, the N-type layer 10 may be formed adjacent the semi-insulating layer 11 by epitaxial means or by diffusion, for example, and then inverted to give the structure shown in FIGURE 1. A layer 12 of silicon oxide, for example, is then formed upon the layer 11. The formation of the silicon oxide layer may be achieved by various techniques. For example, when the layer 11 of semiconductor material is silicon, it may be thermally grown by heating the substrate to a temperature of approximately 1300° C. in the presence of oxygen or steam. An alternate process, one which particularly may be used when the substrate 11 is of another semiconductor material besides silicon, is the pyrolytic decomposition of the siloxanes, such as $Si(OC_2H_5)_4$, whereby the silicon oxide layer 12 is deposited rather than grown upon the semiconductor substrate 11.

Through the use of conventional photographic masking and etching techniques, for example, a select portion of the oxide layer 12 is removed, as shown in FIGURE 2, to form the aperture or window 14. This removal may be accomplished by covering the oxide layer 12 with photoresist, masking the photoresist except for a region corresponding to an area of the window 14, exposing and developing the photoresist, and etching away the unmasked area of the oxide. By this method, an oxide mask is produced directly on the surface of the substrate 11. The mask thus produced liimts the area of the substrate that is to be affected by the subsequent selective etch and epitaxial redeposition.

As the next step in the process of the present invention, the substrate 11 is subjected to a selective etch which removes substantially all of the exposed semi-insulating material of the substrate 11 beneath the window 14 to expose the top surface of the N-type layer 10 within the window 14. (As depicted in FIGURE 2, a small portion of the substrate 10 may also be etched away during the etching of the substrate 11.) This removal may be accomplished by a conventional solution etch, or alternatively by a conventional vapor etch, the etchant being of a composition which removes the exposed semiconductor material beneath the window 14 while substantially unaffecting the oxide mask 12. Consequently, a "pocket" 15 is formed, as shown in FIGURE 2.

Figure 3:
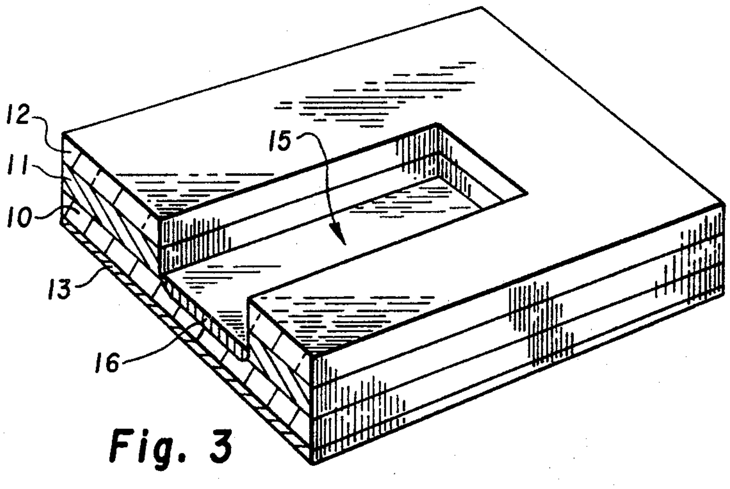

As the next step, a layer 16 of metal is selectively located at the bottom of the pocket 15 beneath the window 14 by electroplating techniques. Accordingly, the composite structure of FIGURE 2 is placed in an electroplating bath of the desired metal constitution, and the substrate layer 10 is made the cathode of the electroplating apparatus. A current is then passed through the bath in a conventional manner, and a metal film 16 selectively plates upon the exposed surface of the N-type layer 10 beneath the window 14, as shown in FIGURE 3. Since the semiconductor layer 11 and the oxide layer 12 are of substantially higher electrical resistance than the N-type layer 10, the metal plates only upon the bottom or base of the pocket 15 where the N-type material is exposed conforming to the exposed surface of the N-type material. The sides or walls of the pocket 15 therefore remain exposed single crystalline semiconductor material. During the electroplating of the metal layer 16, the bottom surface of the N-type layer 10 may be masked with wax or oxide, for example, in those areas which are to remain free of metal. As a particular feature of the invention, however, it may be desirable to not mask this entire surface, so that in addition to the metal layer 16 which is formed, a metal layer 13 plates on the back side of the layer 10, this layer 13 serving as a low resistance contact to the N-type region 10, as shown in FIGURE 3.

Figures 4, 5:
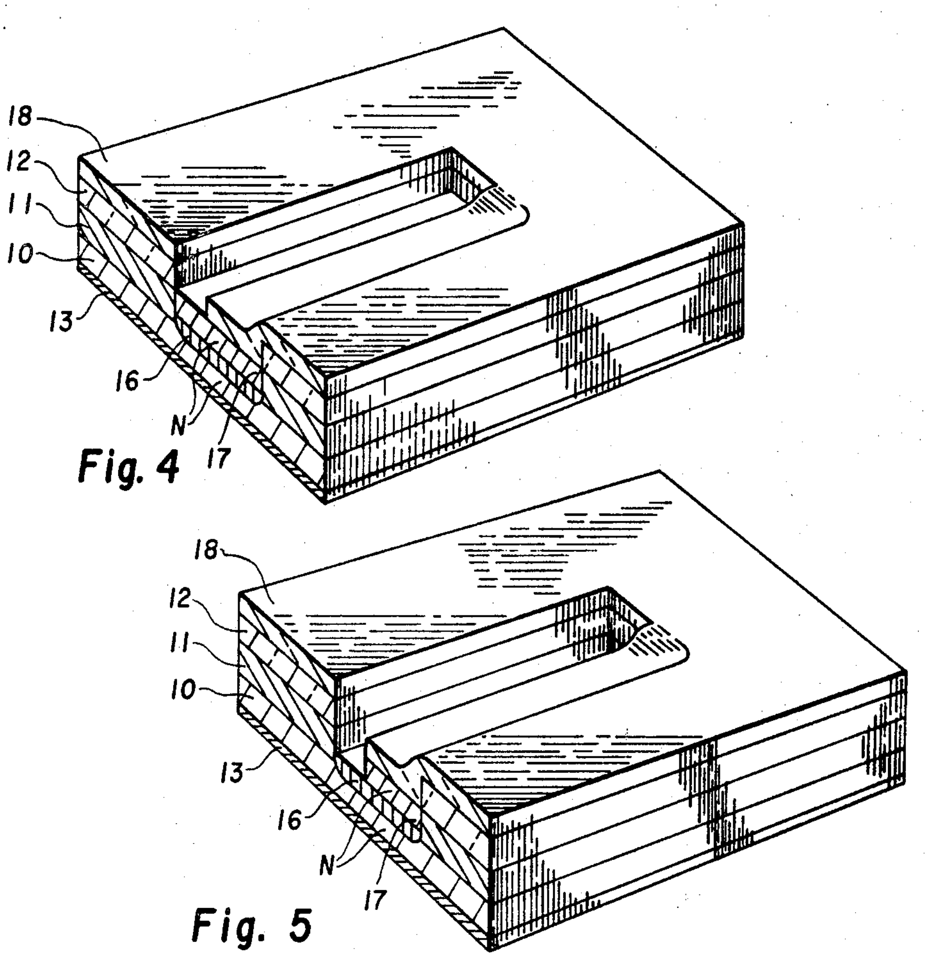
Figure 6:
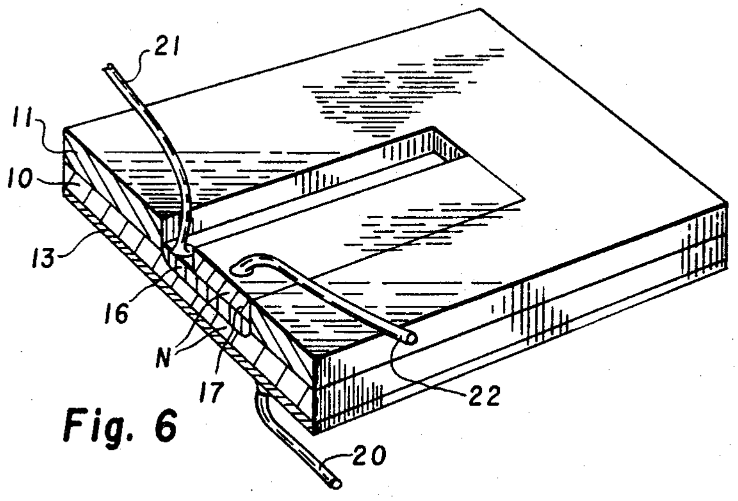

There is then selectively epitaxially redeposited or grown within the pocket 15 a region 17 of single crystalline N-type semiconudctor material as depicted in FIGURE 4. Due to the fact that the walls of the pocket 15 are exposed, single crystalline semiconductor material will grow within the pocket 15 over the metal layer 16 even though the metal layer 16 is present on the bottom of the hole, the epitaxial growth proceeding from the walls inward. (Although FIGURE 4 depicts the grown region 17 as having walls intersecting one another at a well defined angle, in actuality the epitaxially redeposited region 17 will be somewhat cylindrical in shape due to the epitaxial growth from the corners of the pocket 15.) A second oixde layer 18 is then formed over the oxide mask 12 and the N-type semiconductor region 17, and selectively removed by conventional photographic and etching techniques, resulting in the masked structure shown in FIGURE 4.

The unmasked exposed semiconductor material of the region 17 is then subjected to an etchant which selectively removes this material while substantially unaffecting the oxide mask 18 and the metal layer 16, resulting in the structure shown in FIGURE 5.

The oxide layers 12 and 18 are then removed by selective etching, and the external leads 20, 21 and 22 are attached by ball-bonding, for example, to the collector 10, metal base 16, and emitter region 17, respectively.

Various semiconductor materials may be used for the emitter and collector regions, and the emitter and collector need not be of the same semiconductor material. It is desirable, however, to use a semiconductor material which has a high band gap in order to provide good emission efficiency at high temperatures, and one which may be epitaxially grown at low temperatures in order to minimize inter-diffusion of the metal and semiconductor films, and also to minimize surface migration of the atoms in the metal film and their coalescence into islands. In line with these considerations, gallium arsenide semiconductor material is particularly suitable. Germanium semiconductor material may be epitaxially deposited at low temperatures, but it has too low a band gap for good emission efficiency. Silicon can also be used for the active regions and offers a better band gap than germanium but requires high temperatures for epitaxial deposition. In contrast, gallium arsenide has a band gap higher than silicon, namely, 1.42 ev. at room temperature, and requires substrate temperatures of only about 750° C. for epitaxial deposition.

In addition, gallium arsenide semiconductor material is desirable due to the requirements of the semi-insulating layer 11. Since the selective plating of the metal layer 16 depends upon the electrical resistivity of the semiconductor layer 11 being higher than the adjacent semiconductor layer 10, the greater the resistivity of the layer 11, the better. For, although very high resistivities may be achieved with silicon or germanium semiconductor material (often in excess of $10^2$ ohm-cm.), the high resistivities associated with iron or chromium doped gallium arsenide (above $10^4$ ohm-cm.) makes its use desirable.

When gallium arsenide is used as the semiconductor material, a $Br_2$ methanol mixture may be used, for example, for the selective etching step described above with reference to FIGURE 2, when the etch is a solution etch, or $HBr+H_2$ for a vapor etch.

A wide range of metals can be used to form the thin metallic layer 16 between the semiconducting layers 10 and 17. This is permitted because the metal layer need not be single crystalline due to the process of the invention, and may be amorphous or polycrystalline. However, the particular metal used for the metallic layer should be chosen with the following characteristics in mind: (1) relatively long electron-electron mean free path; (2) melting point above that ordinarily reached during processing, especially during the epitaxial growth step; (3) ease of plating; (4) physical and chemical durability; (5) solubility and diffusion in materials used for semiconductor regions adjacent the metallic layer; and (6) ease of surface cleaning prior to epitaxial deposition of the N-type semiconductor region 17. As particular examples, the elements gold, molybdenum and platinum have been found to be favorable for use as the thin metallic layer.

The selective electroplating of the metallic layer 16 (and the layer 13) is dependent, among other considerations, upon the composition of the electroplating bath, the plating current density, the temperature of the electroplating bath, and the ratio of the electrical resistivity of the semiconductor layer 11 to the electrical resistivity of the semiconductor layer 10. When the layer 16 is to be of gold, for example, the electroplating bath may be of a solution of sodium or potassium gold cyanide as the source of gold, and either sodium or potassium cyanide as the electrolyte. In addition, in the last several years, so called "acid gold plating solutions" have been developed. These are aqueous solutions of acid salts and organic acids, such as tartrates and citrates. They also contain either sodium or potassium gold cyanide. Due to the desirability of having the metallic layer 16 of an extremely thin film, it may be desirable to utilize the gold plating solution described in copending U.S. patent application, Ser. No. 492,336, filed Oct. 1, 1965, and assigned to the assignee of the present invention. This solution consists essentially of alkali metal gold cyanide and alkali metal pyrophosphate.

As previously mentioned in order to selectively plate the metallic layer 16 only in the bottom of the pocket 15, it is desirable to have as high a ratio as possible of resistivity of the semiconductor layer 11 to the resistivity of the semiconductor layer 10. Thus, there is no absolute value of resistivity of the layer 11, although the higher the ratio, the more desirable the results.

To minimize electron-phonon collisions and electron-electron collisions within the metal base region 16, thereby increasing the efficiency of the metal base transistor, it is preferable to form the metallic layer 16 as thin as possible (preferably no thicker than 100 or 200 A. and preferably thinner), provided the layer is not discontinuous, its sheet resistance not excessive, and it is closely bonded to the semiconductor regions.

The epitaxial deposition of the N-type semiconductor layer 17 shown in FIGURE 4 is accomplished by a technique which causes preferential growth only upon the exposed semiconductor walls within the pocket 15 shown in FIGURE 3 due to the crystal propagation of this exposed semiconductor material. One such technique is described with reference to FIGURE 7 wherein apparatus suitable for the epitaxial growth of gallium arsenide as the region 17 is shown. The apparatus comprises an elongated quartz reaction vessel 30 having two inlets 31 and 32 and an exhaust 33. A constriction 34 is provided within the vessel 30 which contains a given amount of material 35 of high purity gallium or gallium arsenide. The constriction 34 is so constructed as to cause gas entering through inlet 31 to contact the material 35 as it flows out of the constriction through opening 34_a_, and into the reaction vessel cavity. The reaction vessel 30 is positioned within an appropriate furnace having two separately controlled temperature zones shown at 52 and 53, the zone 52 being maintained at a higher temperature than the zone 53.

A liquid halide 50 of arsenic, for example $AsCl_3$, is contained within a closed vessel, or bubbler 44. The bubbler is only partially filled to leave a vapor-containing space above the liquid. A temperature controlling device 56 is disposed about the bubbler 44 to provide additional control over the amount of $AsCl_3$ admitted into the reaction vessel 30.

The composite structure of FIGURE 3 where the semiconductor layer 11 is of the very high resistivity (semi-insulating) gallium arsenide, is placed in the reaction vessel 30, as shown in FIGURE 7 (where the composite structure is represented as the body 60). The reaction vessel is then flushed with dry helium, admitted through the valve 55 in order to flush atmospheric gases such as oxygen and water vapor from the reaction vessel. The individually controlled furnace zones 52 and 53 are activated to raise the temperature of the material 35 and the body 60 to approximately 900° C. and 750° C., respectively.

A carrier gas, for example hydrogen, is admitted to the apparatus through a valve 40, the gas passing through a flowmeter 42 and tube 43, the tube 43 having its open end submerged in the liquid $AsCl_3$. The liquid $AsCl_3$ in the bubbler 44 is maintained at room temperature. The gas passing through the tube 43 is admitted below the surface of the liquid 50 and near the bottom of the bubbler 44. Gas so admitted rises to the surface of the liquid in small bubbles and thus becomes saturated with vapor of the liquid $AsCl_3$. The saturated gas leaves the bubbler 44 by way of an exit tube 45 feeding into the reaction vessel 30 through the inlet 31, and passes over the gallium or gallium arsenide material 35 within the constriction 34. When the material 35 is gallium, the reaction of the gas with the gallium might be:

$$4\ AsCl_{3(g)} + 12\ Ga_{(l)} \xrightarrow[H_2]{900^\circ\ C.} 12\ GaCl_{(g)} + As_{4(g)}$$

or in the case of the material 35 being gallium arsenide:

$$AsCl_{3(g)} + 3\ GaAs_{(s)} \xrightarrow[H_2]{900^\circ\ C.} 3\ GaCl_{(g)} + As_{4(g)}$$

The resultant gases are then swept into the reaction vessel cavity over the substrate 60 where the following disproportionation reaction at the low temperature occurs:

$$3\ GaCl_{(g)} \xrightarrow[H_2]{750^\circ\ C.} 2\ Ga_{(g)} + GaCl_{3(g)}$$

Formation of GaAs then results from the equation:

$$4\ Ga_{(g)} + As_{4(g)} \xrightarrow[H_2]{750^\circ\ C.} 4\ GaAs_{(s)}$$

N-type doping may be achieved, for example, by adding $H_2S$ to the carrier gas, or impurities such as tin and tellurium may be included in the feed material 35, or may be included in suitable form in the halide solution 50. Using the above described process, when the hydrogen carrier gas is passed through the bubbler 44 at a rate of approximately 100 $cm.^3$/minute, the N-type gallium arsenide layer 17 grows at a rate of approximately 15 microns per hour.

It may be desirable, prior to the above described epitaxial growth to thoroughly clean the metal base layer to assure that no nucleation or growth occurs upon this metal layer.

It is to be pointed out that although the above described fabrication has been referenced to a single metal base transistor, many such devices may be fabricated on a single slice of semiconductor material and then scribed into discrete devices or remain unscribed to have application in an integrated circuit. Also, it is to be noted that the semi-insulating layer 11 not only has utility in the electroplating of the metal layer 16, but also electrically isolates the emitter and collector regions from each other.

While the invention has been described with reference to specific methods and embodiments, it is to be understood that this description is not to be construed in a limiting sense. There are modifications of the disclosed embodiments, as well as other embodiments of the invention that may become apparent to persons skilled in the art without departing from the spirit and scope of the invention as defined by the appended claims. For example, the process of this invention may be utilized whenever a metal layer is formed adjacent a semiconductor body with a metal-semiconductor barrier (Schottky barrier) formed at their interface.

What is claimed is:

1. In a method of fabricating a semiconductor device the steps of:

(a) forming a first layer of semiconductor material adjacent a second layer of semiconductor material, said first layer being of substantially higher electrical resistivity than said second layer, (b) selectively removing a portion of said first layer to form a pocket and expose a surface of said second layer at the bottom of said pocket, the remaining portions of said pocket being of said higher electrical resistivity, (c) electroplating a metal layer within said pocket upon the said exposed surface of said second layer, and (d) epitaxially growing a third region of semiconductor material over said metal layer within said pocket, said epitaxial growth proceeding from the said remaining portions of said pocket and extending substantially laterally over said metal layer.

2. In a method of fabricating a metal base transistor, the steps of:

(a) forming a first layer of N-type monocrystalline semiconductor material adjacent a second layer of monocrystalline semiconductor material, said second layer being of substantially higher resistivity than said first layer, (b) selectively removing a portion of said second layer to form a pocket and expose a surface of said N-type layer at the bottom of said pocket, the remaining portions of said pocket being of said substantially higher resistivity monocrystalline semiconductor material, (c) electroplating a metal layer within said pocket upon the said exposed surface of said N-type layer, said N-type layer serving as the cathode for said electroplating, and (d) epitaxially growing a third region of monocrystalline semiconductor material over said metal layer within said pocket, said epitaxial growth proceeding from the said remaining portions of said pocket and extending substantially laterally over said metal layer.

3. In a method of fabricating a semiconductor device the steps of:

(a) forming a first layer of single crystalline adjacent a second layer of single crystalline semiconductor material, said first layer being of substantially higher electrical resistivity than said second layer, (b) selectively removing a portion of said first layer to form a pocket and expose a surface of said second layer at the bottom of said pocket, the remaining portions of said pocket being of said higher electrical resistivity, (c) electroplating a metal layer within said pocket upon the said exposed surface of said second layer, and (d) epitaxially growing a third region of single crystalline over said metal layer within said pocket, said epitaxial growth proceeding from the said remaining portions of said pocket and extending substantially laterally over said metal layer.

4. In a method of fabricating a metal base transistor, the steps of:

(a) forming a first layer of monocrystalline semiconductor material adjacent one major surface of a second layer of N-type monocrystalline semiconductor material, said first layer being of substantially higher electrical resistivity than said second layer, (b) selectively removing said first layer to form a pocket and expose a portion of said one major surface of said N-type layer at the bottom of said pocket, the walls of said pocket being of said substantially higher electrical resistivity monocrystalline semiconductor material, (c) electroplating a first metal layer within said pocket upon said exposed portion of said one major surface of said N-type layer while at the same time electroplating a second metal layer upon another major surface of said second layer of N-type material, said N-type layer serving as the cathode for said electroplating, and (d) epitaxially growing a third region of monocrystalline semiconductor material over said first metal layer, said epitaxial growth proceeding from the said walls of said pocket and extending substantially laterally over said metal layer.

References Cited

UNITED STATES PATENTS

| | | | |
|---|---|---|---|
| 3,042,565 | 7/1962 | Lehovel. | |
| 3,096,259 | 7/1963 | Williams. | |
| 3,121,809 | 2/1964 | Atalla. | |
| 3,185,935 | 5/1965 | White. | |
| 3,280,391 | 10/1966 | Bittmann et al. | |
| 3,328,216 | 6/1967 | Brown et al. ------ | 29—578 X |
| 3,349,297 | 10/1967 | Crowell et al. | |

JOHN F. CAMPBELL, *Primary Examiner.*

PAUL M. COHEN, *Examiner.*